United States Patent
Benedix et al.

(10) Patent No.: US 6,819,606 B2
(45) Date of Patent: Nov. 16, 2004

(54) METHOD FOR STORING DATA IN A MEMORY DEVICE WITH THE POSSIBILITY OF ACCESS TO REDUNDANT MEMORY CELLS

(75) Inventors: Alexander Benedix, Munich (DE); Stefan Dankowski, Haar-Ottendichl (DE); Reinhard Dueregger, Poing (DE); Wolfgang Ruf, Friedberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/339,031

(22) Filed: Jan. 9, 2003

(65) Prior Publication Data

US 2003/0160288 A1 Aug. 28, 2003

(30) Foreign Application Priority Data

Feb. 4, 2002 (DE) .......................................... 102 04 409

(51) Int. Cl.⁷ ................................................ G11C 7/00
(52) U.S. Cl. ........................................ 365/200; 365/201
(58) Field of Search ................................. 365/200, 201, 365/189.01, 189.12

(56) References Cited

U.S. PATENT DOCUMENTS

| 4,939,694 A | | 7/1990 | Eaton et al. |
| 6,400,618 B1 | * | 6/2002 | Nakamura et al. .......... 365/200 |
| 6,535,436 B2 | * | 3/2003 | Brady ........................ 365/200 |

* cited by examiner

Primary Examiner—David Lam
(74) Attorney, Agent, or Firm—Jenkins, Wilson & Taylor P.A.

(57) ABSTRACT

A method is provided for storing data in a memory device having memory cells arranged in memory cell rows and memory cell columns. The method can include a step for providing redundant memory cells in the memory device. The method can also include a step for localizing defective cells. Further, the method can include a step of accessing the redundant memory cells by means of a predeterminable access mode. The method can also include a step of bypassing defective memory cells of the memory device in a manner dependent on the predeterminable access mode during operation of the memory device for accessing redundant memory cells and for replacement by redundant memory cells. Further, the method can include a step for providing redundant memory cells for storing additional information describing a defect correction.

8 Claims, 2 Drawing Sheets

METHOD FOR STORING DATA IN A MEMORY DEVICE WITH THE POSSIBILITY OF ACCESS TO REDUNDANT MEMORY CELLS

TECHNICAL FIELD

The present invention relates to a method for storing data and a device for storing data, and relates in particular to a method for storing data in a memory device having memory cells arranged in memory cell rows and memory cell columns, system defects brought about by defective memory cells being eliminated.

BACKGROUND ART

During the conception, the design and the construction of memory modules it is unavoidable that system failures brought about by defective memory cells will occur during the operating time of a memory module, i.e. while the memory module is in an active state in a circuit.

In this case, the exact construction of a memory module is insignificant, so that memory modules are hereinafter referred to quite generally as "memory devices". Due to the increasing complexity of electronic circuits and the continuously increasing integration density of circuit units ("chips"), system failures of this type result for example from problems in the reliability of the memory module, brought about by electromigration, etc.

Many electronic systems in which memory units are arranged react very sensitively to an occurrence of memory cell defects, so that the requirements made of reliability and availability of memory units also increase as integration density increases. Due to the increasing complexity of electronic circuit units, it is necessary to effect a trade off between an efficiency of a circuit design and a conception of the hardware to be created. Existing hardware concepts require that they can be used in different circuit environments, even when defective memory cells occur.

FIG. 2 shows a timing diagram of a conventional sequence when a memory cell defect occurs in a conventional memory device. In FIG. 2, a reference symbol 201 designates a conventional system availability, which can vary between 0% and 100%.

A time axis 202 ("Time") designates different points in time and is arranged on a scale such that it is possible to represent a time progression from an occurrence of a memory cell defect 203 up to the end of a booting operation 207. Conventionally, the entire system has to be switched off when a memory cell defect 203 occurs, so that a beginning 204 of a system failure results directly after an occurrence of a memory cell defect 203.

The consequence of conventional system failures is that a system availability 201 falls from 100% (assuming that no further defects occurred) to 0%. Finally, the defective hardware is exchanged, which is expensive and time-consuming particularly in the case of complex electronic systems. A reference symbol 206 specifies a so-called memory exchange time duration.

After the memory exchange time duration 206 has elapsed, the total system failure ends, i.e. the conventional system availability 201 rises again slowly, proceeding from 0%. After a booting time duration 208, the full (100%) conventional system availability 201 is reached again at the end 207 of the booting operation.

Consequently, one disadvantage of conventional methods for eliminating a memory defect is that a long system failure time occurs, which, with reference to FIG. 2, occurs as a sum of the memory exchange time duration 206 and the booting time duration 208.

A further disadvantage of conventional methods for recovering a system availability 201 is that exchanging defective hardware or switching off the entire system is expensive and impracticable, under certain circumstances, since total system failures are to be avoided.

SUMMARY OF THE INVENTION

Consequently, it is an object of the present invention to provide a method for storing data in a memory device in which defective memory cells of a memory unit are replaced by redundant memory cells during the operating time of a memory.

The redundant memory cells are expediently accessed in such a way that a system restart or system booting is avoided.

This object is achieved according to the invention by means of the method specified in patent claim 1 and by means of a memory device having the features of patent claim 9.

Further refinements of the invention emerge from the subclaims.

An essential concept of the invention consists in a system availability being completely or at least partly maintained when a defect occurs in memory cells, in that redundant memory cells present in the memory device undertake the function of defective memory cells.

Thus, one advantage of the present invention is that a system availability (this is possibly slightly reduced) can be maintained even when defects occur in memory cells.

Moreover, it is expedient that the method according to the invention advantageously utilizes effectively always existing redundant memory cells, thereby enabling economical circuit development.

In particular, in the case of a system failure caused by defective memory cells, it is not necessary to exchange system components. In this way, no additional hardware costs arise and a cost-efficient procedure in the case of memory cell defects is achieved.

Furthermore, one advantage of the method according to the invention is that the time of reduced system availability is reduced, so that replacement of defective memory cells can be performed in a short time during operation of the memory unit.

The invention's method for storing data in a memory device having memory cells arranged in memory cell rows and memory cell columns, system defects brought about by defective memory cells being eliminated, essentially has the following steps:

a) provision of redundant memory cells present in the memory device;

b) provision of a predeterminable access mode for accessing the redundant memory cells; and c) replacement of defective memory cells of the memory device by the redundant memory cells in a manner dependent on the predetermined access mode during operation of the memory device.

Advantageous developments and improvements of the respective subject matter of the invention can be found in the subclaims.

In accordance with one preferred development of the present invention, replacement of the defective memory cells of the memory device by the redundant memory cells is provided in a reversible fashion. It is expediently possible for already allocated redundant memory cells which have replaced defective memory cells to be provided with other defective memory cells of the memory device.

In accordance with yet another preferred development of the present invention, a predeterminable number of redundant memory cell rows or a predeterminable number of redundant memory cell columns are provided.

It is thus possible, in an advantageous manner, that, if a defective memory cell occurs in the memory device, the system can determine whether a corresponding memory cell row or a corresponding memory cell column is used for the replacement of the defective memory cell or the defective memory cells.

In a further expedient manner, replacement may be provided by programming a register which, by way of example, comprises both an activation bit and the defective column or row address.

In accordance with yet another preferred development of the present invention, defective memory cells of the memory device are replaced by an exchange of at least one memory cell row and/or at least one memory cell column in a manner dependent on the predetermined access mode during operation of the memory device.

In accordance with yet another preferred development of the present invention, an exchange of defective memory cells of the memory device is carried out in a manner dependent on the predetermined access mode during operation of the memory device by programming an access register, an activation bit and at least one address of the memory cell row and/or the memory cell column which are/is to be replaced advantageously being provided.

In accordance with yet another preferred development of the present invention, the predeterminable access mode for accessing the redundant memory cells during operation of the memory device is provided by a test mode of the memory device.

In accordance with yet another preferred development of the present invention, redundant memory cells for storing an additional information item describing a defect correction are provided.

Consequently, it is advantageously possible to record for example information about the occurrence of a defect in memory cells.

The memory device according to the invention furthermore has:

a) memory cells arranged in memory cell rows and memory cell columns and serving for storing data; and b) redundant memory cells for replacing defective memory cells during the operation of the memory device.

Exemplary embodiments of the invention are illustrated in the drawings and are explained in more detail in the description below.

BRIEF DESCRIPTION OF THE DRAWINGS

In the drawings:

FIG. 3 illustrates a memory device 300 including memory cells 302 arranged in memory cell rows and memory cell columns. Memory device 300 includes one or more redundant memory cells 304 for replacing any of memory cells 302 that are defective, such as, for example, defective memory cell 306. A defect can occur at any time in one of memory cells 302. Memory device 300 also includes one or more redundant memory cells 308 for storing additional information describing a defect correction.

DETAILED DESCRIPTION OF THE INVENTION

In the figures, identical reference symbols designate identical or functionally identical components or steps.

Figure 1:
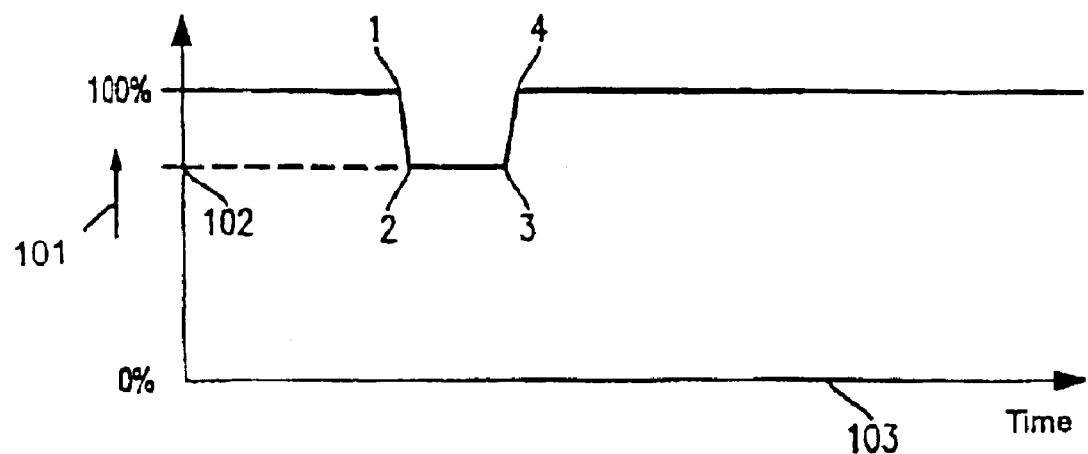
FIG. 1 shows a timing chart for the replacement of defective memory cells in a memory device by redundant memory cells of the memory device during operation of the memory device.
Figure 3:
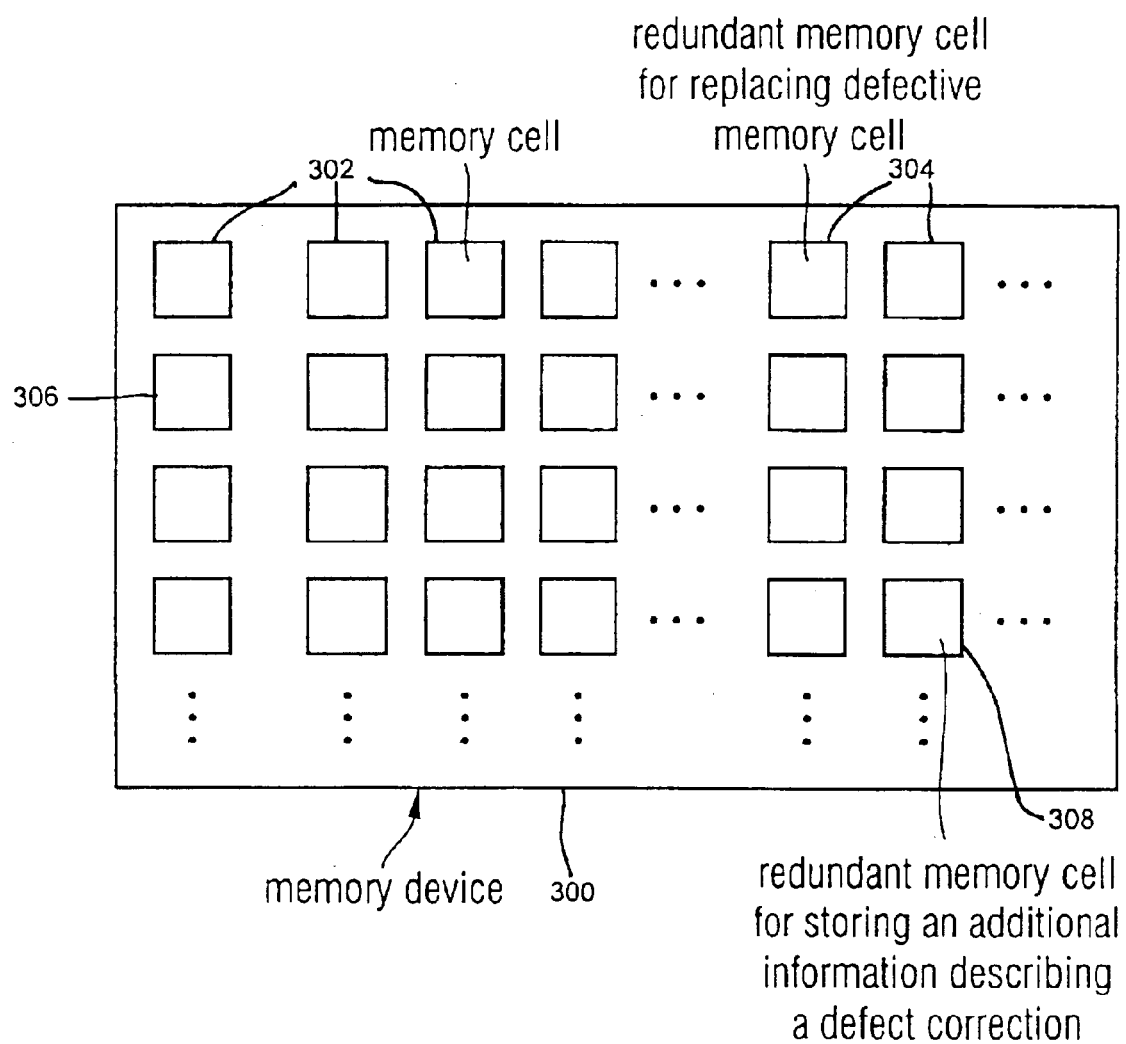
FIG. 3 shows a schematic diagram of a memory device having memory cells arranged in memory cell rows and memory cell columns.

The timing chart shown in FIG. 1 reveals that a system availability 101 has not completely fallen to 0 (0%) during the entire operating time or during the entire operation of memory device 300 (FIG. 3) or system in which memory device 300 is integrated. A profile of the system availability 103 is plotted against a time axis 103 ("Time"), it being assumed that a memory cell defect occurs during the operating time of memory device 300.

First let it be assumed that a 100% system availability 101 is initially present. When a memory cell defect occurs, designated by the reference symbol 1 in FIG. 1, the system availability will decreased. Let it be assumed that a memory cell defect has occurred such that the system availability is reduced to a reduced value, i.e. the reduced system availability 102 (dashed line in FIG. 1).

Further operation of the memory device 300 (FIG. 3) is advantageously ensured, although with (possibly only slight) reduced system availability 101. After a memory cell defect has occurred (step 1), defect localization and redundancy selection are carried out in step 2 (FIG. 1).

When a defective memory cell occurs, the system determines whether a corresponding memory cell row or a corresponding memory cell column is replaced. The replacement is effected for example by programming a register which has both an activation bit and an address of a defective column and/or row. In this case, an access register would be necessary per redundant memory cell row or memory cell column. A localization of a defective memory cell (such as defective memory cell 306 shown in FIG. 3) and an access to or a selection of redundant memory cells (such as redundant memory cells 304 shown in FIG. 3) are likewise effected in FIG. 2.

Once defect localization and redundancy selection has been carried out in step 2, the system provides a bypass for accessing redundant memory cells in an access register. The access register provides the bypass in a step 3, which directly follows step 2 and prevents a further reduction of the system availability 101. Consequently, a defect localization, a redundancy selection and a bypass for accessing redundant memory cells can be provided during the operating time of the memory device.

After step 3, the system advances, since defective memory cells have been replaced by redundant memory cells, to step 4, in which the full (100%) system availability 101 has been recovered.

Furthermore, the system can determine, in memory device 300, redundant memory cells 308 which are provided for storing an additional information item describing a defect correction. Identification of these memory cells 308 which store an additional information item describing defect correction serves for rapidly finding a memory cell defect and facilitating a determination of a defect progression in memory device 300.

Figure 2:
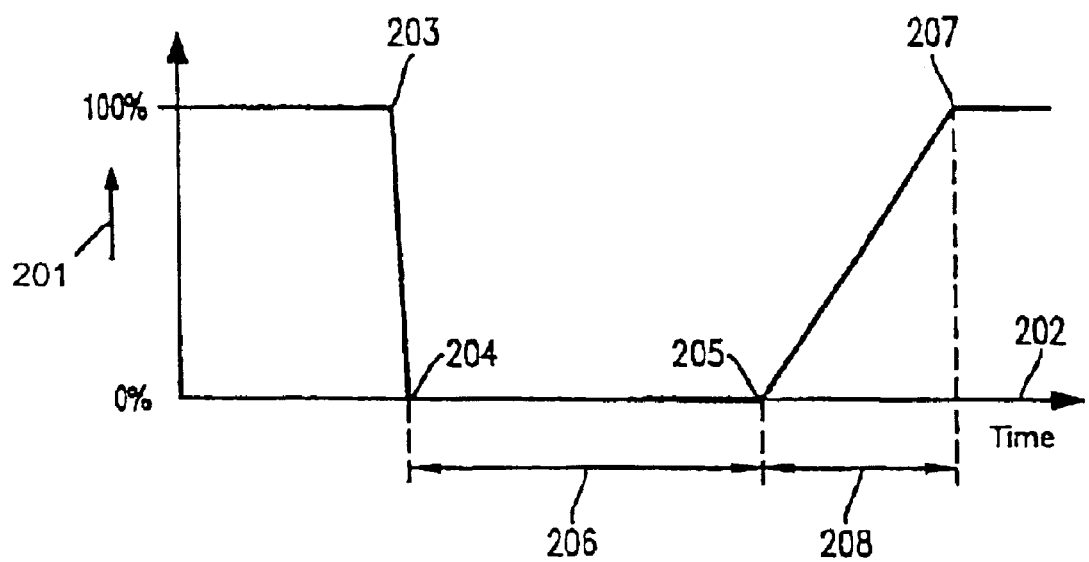
FIG. 2 shows a timing chart of a conventional method for replacing defective memory cells.

With regard to the time sequence of a conventional method for replacing defective memory cells in a memory device as illustrated in FIG. 2, reference is made to the introduction to the description.

Although the present invention has been described above using preferred exemplary embodiments, it is not restricted thereto, but rather can be modified in diverse ways.

Moreover, the invention is not restricted to the application possibilities mentioned.

What is claimed is:

1. Method for storing data in a memory device having memory cells arranged in memory cell rows and memory cell columns, the method comprising the following steps:
   (a) providing redundant memory cells in the memory device;
   (b) localizing of defective memory cells;
   (c) accessing the redundant memory cells by means of a predeterminable access mode;
   (d) bypassing defective memory cells of the memory device in a manner dependent on the predeterminable access mode during operation of the memory device for accessing redundant memory cells and for replacement by redundant memory cells; and
   (e) providing redundant memory cells for storing additional information describing a defect correction.

2. Method according to claim 1, wherein replacement of the defective memory cells of the memory device by the redundant memory cells is provided in a reversible manner.

3. Method according to claim 1, wherein a predeterminable number of redundant memory cell rows are provided.

4. Method according to claim 1, wherein a predeterminable number of redundant memory cell columns are provided.

5. Method according to claims 3 or 4, wherein defective memory cells of the memory device are replaced by an exchange of at least one memory cell row and/or at least one memory cell column in a manner dependent on the predetermined access mode during operation of the memory device.

6. Method according to claim 5, wherein an exchange of defective memory cells of the memory device is carried out in a manner dependent on the predetermined access mode during operation of the memory device by programming an access register which contains an activation bit and at least one address of the memory cell row and/or of the memory cell column being replaced.

7. Method according to claim 5, wherein the predeterminable access mode for accessing the redundant memory cells during operation of the memory device is provided by a test mode of the memory device.

8. Memory device comprising:
   (a) memory cells arranged in memory cell rows and memory cell columns and serving for storing data;
   (b) redundant memory cells for replacing defective memory cells during the operation of the memory device; and
   (c) redundant memory cells for storing additional information describing a defect correction, wherein the steps of localizing of defective memory cells, accessing the redundant memory cells by means of a predetermined access mode, and bypassing defective memory cells of the memory device in a manner dependent on the predetermined access mode during operation of the memory device for accessing redundant memory cells and for a replacement by redundant memory cells are performed.

* * * * *